United States Patent
Qiu et al.

(10) Patent No.: US 10,802,521 B2
(45) Date of Patent: Oct. 13, 2020

(54) VOLTAGE REGULATOR WITH CURRENT-LIMITING AND FEED-FORWARD CIRCUIT

(71) Applicant: NXP USA, INC., Austin, TX (US)

(72) Inventors: Liang Qiu, Tianjin (CN); Meng Wang, Tianjin (CN); John Pigott, Arizona, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/237,726

(22) Filed: Jan. 1, 2019

(65) Prior Publication Data
US 2019/0220049 A1 Jul. 18, 2019

(30) Foreign Application Priority Data
Jan. 18, 2018 (CN) .......................... 2018 1 0051497

(51) Int. Cl.
| | | |
|---|---|---|
| G05F 1/575 | (2006.01) | |
| H02H 9/02 | (2006.01) | |
| G01R 19/165 | (2006.01) | |
| H03F 3/45 | (2006.01) | |
| G05F 1/46 | (2006.01) | |
| G05F 3/26 | (2006.01) | |

(52) U.S. Cl.
CPC ....... *G05F 1/575* (2013.01); *G01R 19/16552* (2013.01); *G05F 1/465* (2013.01); *H02H 9/025* (2013.01); *H03F 3/45* (2013.01); *G05F 3/262* (2013.01)

(58) Field of Classification Search
CPC . G05F 1/56; G05F 1/562; G05F 1/563; G05F 1/565; G05F 1/569; G05F 1/573; G05F 1/5735; G05F 1/575
See application file for complete search history.

(56) References Cited

U.S. PATENT DOCUMENTS

| | | | | |
|---|---|---|---|---|
| 3,419,849 A | * | 12/1968 | Anderson | G05F 1/569 710/49 |
| 5,610,503 A | * | 3/1997 | Fogg | G05F 1/575 323/283 |
| 6,313,616 B1 | * | 11/2001 | Deller | G05F 1/575 323/282 |
| 6,525,515 B1 | * | 2/2003 | Ngo | G05F 1/573 323/274 |
| 6,559,623 B1 | * | 5/2003 | Pardoen | G05F 1/573 323/273 |
| 6,842,068 B2 | * | 1/2005 | Perrier | G05F 1/575 323/280 |
| 7,030,596 B1 | * | 4/2006 | Salerno | H02M 3/158 323/282 |
| 7,542,258 B2 | | 6/2009 | Black | |
| 7,893,670 B2 | * | 2/2011 | Pulijala | G05F 1/575 323/273 |
| 8,194,379 B2 | | 6/2012 | Herr et al. | |

(Continued)

*Primary Examiner* — Thienvu V Tran
*Assistant Examiner* — Nusrat Quddus

(57) ABSTRACT

A voltage regulation system has a voltage regulator, a current-limiting circuit, and a feed-forward circuit. The voltage regulator regulates an output voltage to a desired voltage level. The current-limiting circuit controls an output current of the voltage regulator to a desired current level. The feed-forward circuit, which has a fast response time, controls an inrush current in the output current caused by a decrease in an output voltage.

20 Claims, 3 Drawing Sheets

(56) References Cited

U.S. PATENT DOCUMENTS

| | | | | |
|---|---|---|---|---|
| 2003/0076638 A1* | 4/2003 | Simonelli | ............... | G05F 1/571 |
| | | | | 361/56 |
| 2004/0008079 A1* | 1/2004 | Osamura | ................. | G05F 1/575 |
| | | | | 327/540 |
| 2009/0072803 A1* | 3/2009 | Tiew | ........................ | G05F 1/573 |
| | | | | 323/277 |
| 2009/0167266 A1* | 7/2009 | Al-Shyoukh | ........... | G05F 1/569 |
| | | | | 323/276 |
| 2016/0043539 A1* | 2/2016 | Mallala | .................... | G05F 1/573 |
| | | | | 361/18 |
| 2016/0147239 A1* | 5/2016 | Yan | ......................... | G05F 1/575 |
| | | | | 323/280 |
| 2016/0211751 A1* | 7/2016 | Kurozo | .................... | G05F 1/573 |
| 2017/0063076 A1* | 3/2017 | Hou | ........................ | H02H 9/025 |
| 2017/0179820 A1* | 6/2017 | Zhang | ..................... | H02M 3/00 |
| 2018/0048232 A1* | 2/2018 | Adell | .................. | H02M 3/1563 |

* cited by examiner

VOLTAGE REGULATOR WITH CURRENT-LIMITING AND FEED-FORWARD CIRCUIT

BACKGROUND

The present invention relates generally to voltage regulators, and, more particularly, to a feed-forward circuit for controlling inrush current in an output current of a voltage regulator.

Integrated circuits, such as system-on-chips (SoCs) and application specific integrated circuits (ASICs), integrate various analog and digital components on a single chip. These components require stable supply voltage to function correctly. Thus, integrated circuits include voltage regulators, such as a low dropout (LDO) voltage regulator to regulate the supply voltage. The LDO voltage regulator rejects noise injected into the supply voltage from a voltage source and provides a regulated output voltage, even when the supply voltage is very close to the regulated output voltage. Integrated circuits further include current-limiting circuits to protect the components from damage caused by current inrush.

FIG. 1 shows a conventional voltage regulation system 100 that includes a LDO voltage regulator 102 connected to a current-limiting circuit 104. The voltage regulator 102 is connected between a supply voltage $V_{in}$ and ground. The voltage regulator 102 generates and regulates an output voltage $V_{out}$ to a desired voltage level. The voltage regulator 102, which is connected to a load capacitor 106 and a load 108, includes a first differential amplifier 110, a pass transistor 112, and a resistive network 114.

The first differential amplifier 110 receives a reference voltage $V_{ref}$ and a feedback voltage $V_{fb}$, and generates an error voltage $V_{error}$. The pass transistor 112 receives the error voltage $V_{error}$ at its gate and generates the output voltage $V_{out}$ at its drain. The resistive network 114, which includes first and second resistors 116a and 116b, is connected between ground and the pass transistor 112 and receives the output voltage $V_{out}$.

The current-limiting circuit 104 is connected to the voltage regulator 102 for limiting an output current $I_{out}$ of the voltage regulator 102 to a safe operating area (SOA). The SOA indicates maximum voltage and current levels for operating the pass transistor 112 and the load 108 without any damage. The current-limiting circuit 104 includes a current-sensing circuit 118, a second differential amplifier 120, and a control transistor 122.

The current-sensing circuit 118 detects an increase in the output current $I_{out}$ of the voltage regulator 102 from the desired current level and generates a first intermediate voltage $V_{int1}$. The current-sensing circuit 118 includes a third resistor 124 and a first transistor 126. The second differential amplifier 120 receives the first intermediate voltage $V_{int1}$ and the supply voltage $V_{in}$, and generates a control voltage $V_{pu}$. The control transistor 122 receives the control voltage $V_{pu}$ at its gate. The control voltage $V_{pu}$ activates the control transistor 122 to generate a second intermediate voltage $V_{int2}$. The second intermediate voltage $V_{int2}$ pulls-up a voltage level at the gate of the pass transistor 112 to reduce a conduction level of the pass transistor 112. When the conduction level of the pass transistor 112 is reduced, the output current $I_{out}$ of the voltage regulator 102 also is reduced to the desired current level.

Typically, current-limiting circuits, such as the current-limiting circuit 104, form a feedback loop for controlling the output current. Hence, the current-limiting circuit 104 has a slow response time. Due to this slow response time, the output current $I_{out}$ experiences an inrush for a short duration at the beginning of a short-circuit event at the load 108, after which the output current $I_{out}$ is limited to the desired current level. For high power circuits, the duration of the inrush may be negligible, however, the duration of the inrush may be sufficiently long to cause damage to low power circuits (such as the pass transistor 112). In certain scenarios, the duration of the inrush can be as long as 100 microseconds (µs) and an amplitude of the output current $I_{out}$ as high as 10 Amperes (A). The inrush in the output current $I_{out}$ further results in increased power dissipation in the pass transistor 112, which is undesirable.

Therefore, it would be advantageous to have a voltage regulator that has a fast response time and prevents inrush current in an output current thereof.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a voltage regulation. The voltage regulation system comprises a voltage regulator, a current-limiting circuit, and a feed-forward circuit. The voltage regulator receives a supply voltage, a reference voltage, and a feedback voltage, and generates an output voltage. The current-limiting circuit receives the supply voltage, and is connected to the voltage regulator. The current-limiting circuit generates a control voltage for controlling an output current of the voltage regulator. The feed-forward circuit receives the supply voltage, and is connected to the voltage regulator for receiving the output voltage. The feed-forward circuit generates a control signal to pull down a voltage level of the control voltage when the output voltage decreases from a first threshold voltage level, thereby controlling an inrush in the output current.

In one embodiment, the feed-forward circuit comprises a detection circuit and a control circuit. The detection circuit receives the output voltage from the voltage regulator. The detection circuit detects when the output voltage decreases from a first threshold voltage level. The control circuit is connected to the supply voltage, and to the detection circuit, and generates a control signal to pull down a voltage level of the control voltage when the detection circuit detects a decrease in the output voltage from the first threshold voltage level, thereby controlling an inrush in the output current.

The feed-forward circuit detects a sudden and significant decrease in the output voltage, and generates the control signal based on the decrease in the output voltage. Based on the control signal, the feed-forward circuit controls a voltage level of the control voltage, thereby preventing the inrush in the output current. The feed-forward circuit forms a feed-forward loop for preventing the inrush in the output current. The feed-forward circuit has a faster response time than the current-limiting circuit, hence preventing inrush in the output current.

Figure 1:
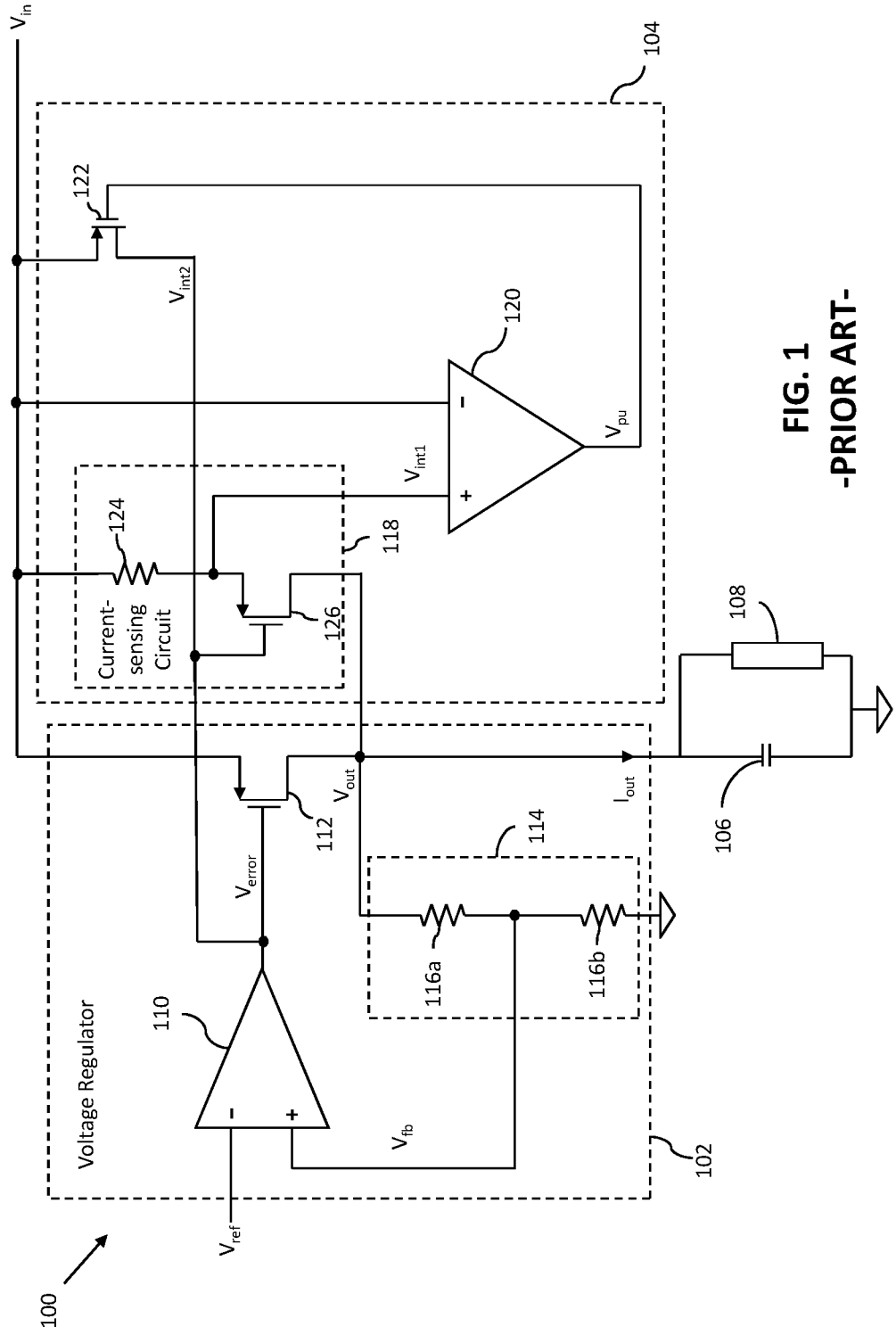
FIG. 1 is a schematic circuit diagram of a conventional voltage regulation system that includes a voltage regulator.
Figure 2:
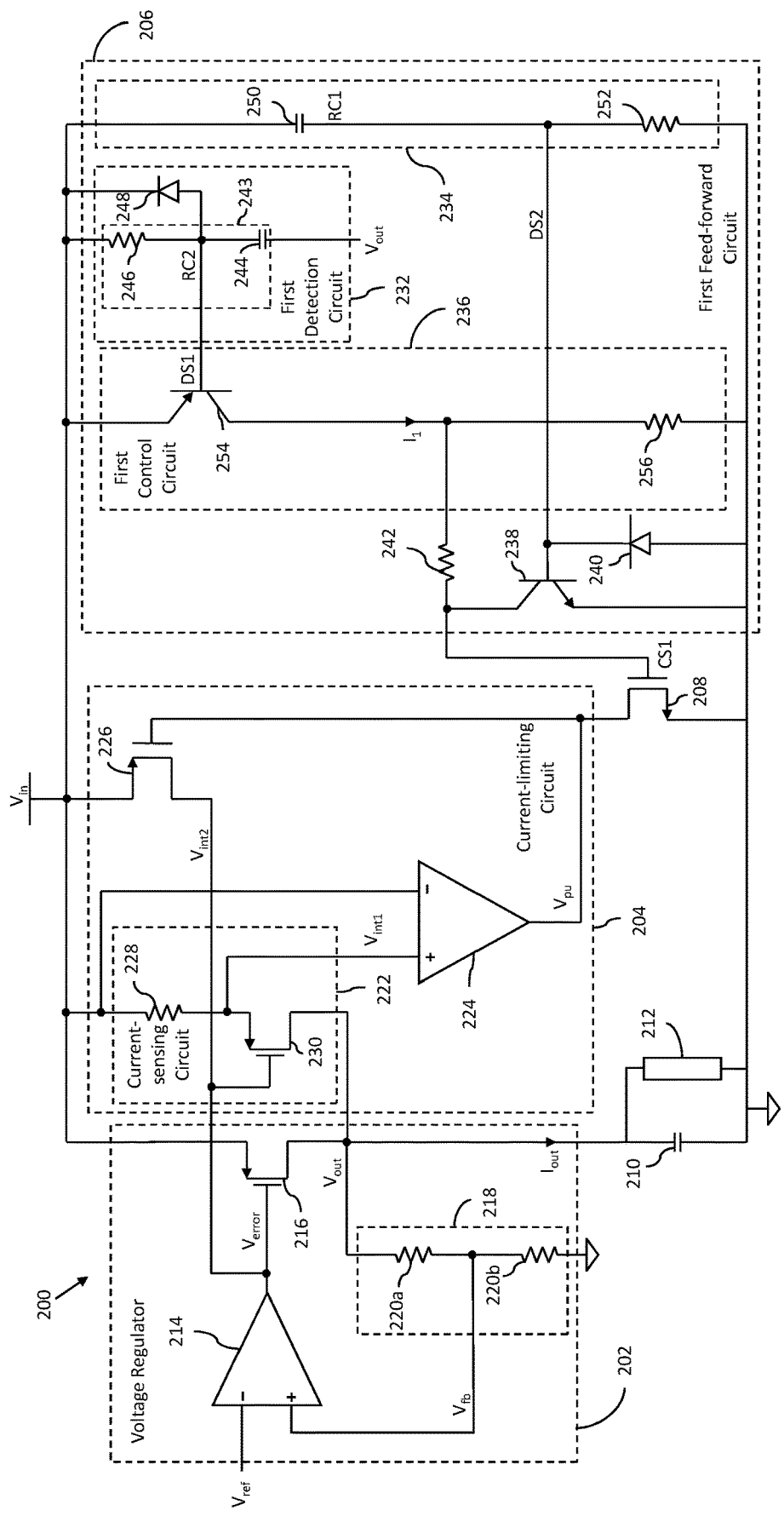
FIG. 2 is a schematic circuit diagram of a voltage regulation system that includes a voltage regulator connected to a current-limiting circuit and a first feed-forward circuit, in accordance with an embodiment of the present invention.

Referring now to FIG. 2, a schematic circuit diagram of a voltage regulation system 200 that includes a voltage regulator 202 connected to a current-limiting circuit 204 and a first feed-forward circuit 206, in accordance with an embodiment of the present invention, is shown. The voltage regulation system 200 further includes a control switch 208, a load capacitor 210, and a load 212.

The voltage regulator 202 is connected between a supply voltage $V_{in}$ and ground. The supply voltage $V_{in}$ is generated by an external power supply (not shown). The voltage regulator 202 receives a reference voltage $V_{ref}$ and a feedback voltage $V_{fb}$, and generates an output voltage $V_{out}$. The voltage regulator 202 regulates the output voltage $V_{out}$ to a desired voltage level. The voltage regulator 202 is a low-power voltage regulator, such as a LDO voltage regulator. The voltage regulator 202 includes a first differential amplifier 214, a pass transistor 216, and a resistive network 218.

The first differential amplifier 214 has an inverting terminal and a non-inverting terminal for receiving the reference voltage $V_{ref}$ and the feedback voltage $V_{fb}$, respectively. The first differential amplifier 214 generates an error voltage $V_{error}$ at its output terminal. The reference voltage $V_{ref}$ is a band gap reference voltage signal having a desired voltage level. The reference voltage $V_{ref}$ is generated by an external reference voltage generator (not shown).

The pass transistor 216 is a p-channel metal-oxide semiconductor (PMOS) transistor. The pass transistor 216 has a source terminal that receives the supply voltage $V_{in}$ and a gate terminal connected to the output terminal of the first differential amplifier 214 for receiving the error voltage $V_{error}$. The pass transistor 216 further has a drain terminal for generating the output voltage $V_{out}$. In one embodiment, the drain terminal of the pass transistor 216 represents an output terminal of the voltage regulator 202.

The resistive network 218 is a voltage divider circuit, and includes first and second resistors 220a and 220b connected in series between the drain terminal of the pass transistor 216 and ground. The resistive network 218 receives the output voltage $V_{out}$ and generates the feedback voltage $V_{fb}$, which is provided to the first differential amplifier 214. The resistive network 218 has a voltage tap between the first and second resistors 220a and 220b for generating the feedback voltage $V_{fb}$, which is a fraction of the output voltage $V_{out}$. It will be understood by those of skill in the art that the resistive network 218 can include any number of resistors.

The load capacitor 210 has a first terminal connected to the drain terminal of the pass transistor 216 for receiving the output voltage $V_{out}$, and a second terminal connected to ground. The load capacitor 210 increases the stability of the voltage regulator 202. The load capacitor 210 and the load 212 form the load of the voltage regulator 202.

The first differential amplifier 214 amplifies a difference between the feedback voltage $V_{fb}$ and the reference signal $V_{ref}$ to generate the error voltage $V_{error}$. The error voltage $V_{error}$ controls a conduction level of the pass transistor 216 for regulating the output voltage $V_{out}$ to the desired voltage level. In a preferred embodiment, when the output voltage $V_{out}$ of the voltage regulator 202 falls below the desired voltage level, the feedback voltage $V_{fb}$ also decreases. Based on the decrease in the feedback voltage $V_{fb}$, the first differential amplifier 214 pulls down a voltage level of the error voltage $V_{error}$, thereby increasing the conduction level of the pass transistor 216. Due to increase in the conduction level of the pass transistor 216, the output voltage $V_{out}$ increases to maintain the desired voltage level. In another embodiment, when the output voltage $V_{out}$ of the voltage regulator 202 increases from the desired voltage level, the feedback voltage $V_{fb}$ also increases. Based on the increase in the feedback voltage $V_{fb}$, the first differential amplifier 214 pulls up a voltage level of the error voltage $V_{error}$, thereby decreasing the conduction level of the pass transistor 216. Due to decrease in the conduction level of the pass transistor 216, the output voltage $V_{out}$ decreases to maintain the desired voltage level.

In one scenario, the decrease in the output voltage $V_{out}$ is caused by variations in the resistance of the load 212, such as short-circuiting of the load 212. In such scenarios, the decrease in the output voltage $V_{out}$ results in an increase in an output current $I_{out}$ of the voltage regulator 202. The increased output current $I_{out}$ could damage the pass transistor 216. The current-limiting circuit 204 connected to the voltage regulator 202 controls the output current $I_{out}$ within a safe operating area (SOA), thereby preventing damage to the pass transistor 216. The SOA defines maximum voltage and current levels for operating the pass transistor 216. The current-limiting circuit 204 includes a current-sensing circuit 222, a second differential amplifier 224, and a control transistor 226.

The current-sensing circuit 222 is connected to the supply voltage $V_{in}$ and the drain terminal of the pass transistor 216. The current-sensing circuit 222 generates a first intermediate voltage $V_{int1}$ based on an increase in the output current $I_{out}$. The current-sensing circuit 222 includes a third resistor 228 and a first transistor 230.

The third resistor 228 has a first terminal connected to the supply voltage $V_{in}$ and a second terminal connected to the first transistor 230. The first transistor 230 is a PMOS transistor that has a source terminal connected to the third resistor 228, and drain and gate terminals connected to the drain and gate terminals of the pass transistor 216, respectively. The gate terminal of the first transistor 230 is further connected to the output terminal of the first differential amplifier 214. The first transistor 230 senses the increase in the output current $I_{out}$. The output current $I_{out}$ sensed by the first transistor 230 creates a voltage drop across the third resistor 228. Based on the voltage drop across the third resistor 228, the first intermediate voltage $V_{int1}$ is generated. In one embodiment, the difference between the supply voltage $V_{in}$ and the voltage drop across the third resistor 228 represents the first intermediate voltage $V_{int1}$. The current-sensing circuit 222 has a voltage tap at the second terminal of the third resistor 228 for outputting the first intermediate voltage $V_{int1}$.

The second differential amplifier 224 has an inverting terminal for receiving the supply voltage $V_{in}$. The second differential amplifier 224 further has a non-inverting terminal connected to the second terminal of the third resistor 228 for receiving the first intermediate voltage $V_{int1}$. The non-inverting terminal of the second differential amplifier 224 is further connected to the source terminal of the first transistor 230. The second differential amplifier 224 generates a control voltage $V_{pu}$ at its output terminal.

The control transistor 226 is a PMOS transistor. The control transistor 226 has a source terminal that receives the supply voltage $V_{in}$ and a gate terminal connected to the output terminal of the second differential amplifier 224 for receiving the control voltage $V_{pu}$. The control transistor 226 further has a drain terminal connected to the gate terminals of the pass transistor 216 and the first transistor 230. The control transistor 226 generates a second intermediate voltage $V_{int2}$ at its drain terminal. The control transistor 226 further provides the second intermediate voltage $V_{int2}$ to the gate terminals of the pass transistor 216 and the first transistor 230.

When the output current $I_{out}$ increases from the desired current level, the current flowing through the first transistor 230 also increases. The increase in the output current $I_{out}$ increases the voltage drop across the third resistor 228. Based on the increase in the voltage drop across the third resistor 228, the first intermediate voltage $V_{int1}$ (i.e., the difference between the supply voltage $V_{in}$ and the voltage drop across the third resistor 228) decreases. The second differential amplifier 224 then receives the first intermediate voltage $V_{int1}$, and amplifies a difference in the first intermediate voltage $V_{int1}$ and the supply voltage $V_{in}$ to generate the control voltage $V_{pu}$. Based on the decrease in the first intermediate voltage $V_{int1}$, a voltage level of the control voltage $V_{pu}$ is pulled down and the control transistor 226 turns on. When the control transistor 226 is turned on (i.e., activated), the control transistor 226 generates and provides the second intermediate voltage $V_{int2}$ to the pass transistor 216 and the first transistor 230. The control transistor 226 further pulls up the voltage level of the second intermediate voltage $V_{int2}$ to decrease the conduction level of the pass transistor 216 and the first transistor 230. As a result, the output current $I_{out}$ of the voltage regulator 202 is decreased to achieve the desired current level. The current-limiting circuit 204 thus forms a feedback loop for controlling the output current $I_{out}$ to the desired current level.

The first feed-forward circuit 206 receives the supply voltage $V_{in}$ and is connected to the voltage regulator 202 for receiving the output voltage $V_{out}$. The first feed-forward circuit 206 is further connected to the current-limiting circuit 204 by way of the control switch 208. The first feed-forward circuit 206 forms a feed-forward loop to control an inrush in the output current $I_{out}$. The first feed-forward circuit 206 includes a first detection circuit 232, a first resistor-capacitor (RC) network 234 (RC1), and a first control circuit 236. The first feed-forward circuit 206 further includes a second transistor 238, a first diode 240, and a fourth resistor 242.

The first detection circuit 232 receives the supply voltage $V_{in}$, and is connected to the voltage regulator 202 for receiving the output voltage $V_{out}$. The first detection circuit 232 is further connected to the first control circuit 236. The first detection circuit 232 includes a second RC network 243 (RC2) including a capacitor 244 and a fifth resistor 246. The first detection circuit 232 further includes a second diode 248.

The second RC network 243 receives the supply voltage $V_{in}$, and is connected to the voltage regulator 202 for receiving the output voltage $V_{out}$. The second RC network 243 detects at least one of the decrease in the output voltage $V_{out}$ and an increase in the supply voltage $V_{in}$.

The first capacitor 244 has a first terminal connected to the output terminal of the voltage regulator 202 for receiving the output voltage $V_{out}$, and a second terminal connected to the fifth resistor 246. The fifth resistor 246 has a first terminal connected to the supply voltage $V_{in}$ and a second terminal connected to the second terminal of the first capacitor 244. The first capacitor 244 and the fifth resistor 246 generate a first detection signal DS1 based on at least one of the decrease in the output voltage $V_{out}$ from the first threshold voltage level or the increase in the supply voltage $V_{in}$ from a second threshold voltage level. In one embodiment, the first capacitor 244 and the fifth resistor 246 generate the first detection signal DS1 when the output voltage $V_{out}$ falls by 1 Volt/microseconds (V/μs) from the desired voltage level. Thus, the first threshold voltage level in such a scenario is 1 V less than the desired voltage level. In another embodiment, the first capacitor 244 and the fifth resistor 246 generate the first detection signal DS1, when the supply voltage $V_{in}$ increases by 1 V/μs. Thus, the first threshold voltage level in such a scenario is 1 V higher than the voltage level of the supply voltage $V_{in}$.

The second diode 248 has a first terminal for receiving the supply voltage $V_{in}$, and a second terminal connected to the second terminal of the fifth resistor 246, the second terminal of the first capacitor 244, and the first control circuit 236. The second diode 248 provides a discharge path to the first capacitor 244. The second diode 248 improves an operational speed of the second RC network 243.

The first RC network 234 is connected between the supply voltage $V_{in}$ and ground. The first RC network 234 detects the increase in the supply voltage $V_{in}$. The first RC network 234 generates a second detection signal DS2 based on the increase in the supply voltage $V_{in}$ from the second threshold voltage level. The first RC network 234 includes a second capacitor 250 and a sixth resistor 252.

The second capacitor 250 has a first terminal connected to the supply voltage $V_{in}$ and a second terminal connected to the sixth resistor 252. The sixth resistor 252 has a first terminal connected to the second capacitor 250 and a second terminal connected to ground. When the supply voltage $V_{in}$ increases from the second threshold voltage level, the second capacitor 250 charges and generates the second detection signal DS2.

The first control circuit 236 is connected to ground, and receives the supply voltage $V_{in}$. The first control circuit 236 is further connected to the first detection circuit 232 for receiving the first detection signal DS1. The first control circuit 236 generates a first control signal CS1 based on the first detection signal DS1. In other words, the first control circuit 236 generates the first control signal CS1 when the first detection circuit 232 detects at least one of the decrease in the output voltage $V_{out}$ from the first threshold voltage level or the increase in the supply voltage $V_{in}$ from the second threshold voltage level. The first control circuit 236 includes a third transistor 254 and a seventh resistor 256.

The third transistor 254 is a PNP type bi-polar junction transistor (BJT). The third transistor 254 has an emitter terminal that receives the supply voltage $V_{in}$, and a base terminal connected to the first capacitor 244 and the fifth resistor 246 for receiving the first detection signal DS1. The third transistor 254 further has a collector terminal connected to the fourth resistor 242 and the seventh resistor 256. The seventh resistor 256 has a first terminal connected to the collector terminal of the third transistor 254 and a second terminal connected to ground. When the third transistor 254 is turned on based on the first detection signal DS1, a first current signal $I_1$ flows from the third transistor 254 to the seventh resistor 256, thereby creating a voltage drop across the seventh resistor 256. Based on the voltage drop across the seventh resistor 256, the first control signal CS1 is generated. The second diode 248 provides the discharge path to the first capacitor 244 towards the base terminal of the third transistor 254.

The second transistor 238 is an NPN type BJT. The second transistor 238 has an emitter terminal connected to ground, a collector terminal connected to the fourth resistor 242, and a base terminal connected to the first RC network 234 for receiving the second detection signal DS2. The base terminal of the second transistor 238 is further connected to the first diode 240. The second transistor 238, when activated, prevents the first control signal CS1 to close the control switch 208.

The first diode 240 has a first terminal connected to the base terminal of the second transistor 238 and a second terminal that is connected to ground. The first diode 240 provides a discharge path to the second capacitor 250 towards the base terminal of the second transistor 238. Thus, the first diode 240 improves an operational speed of the first RC network 234.

The fourth resistor 242 is a current-limiting resistor that has a first terminal connected to the collector terminal of the third transistor 254, and a second terminal connected to the gate terminal of the control switch 208. The second terminal of the fourth resistor 242 is further connected to the collector terminal of the second transistor 238. The fourth resistor 242 limits a current level of the first control signal CS1.

The control switch 208 has a source terminal connected to ground, a gate terminal connected to the first feed-forward circuit 206 for receiving the first control signal CS1, and a drain terminal connected to the output terminal of the second differential amplifier 224. The drain terminal of the control switch 208 is further connected to the gate terminal of the control transistor 226. The control switch 208 is an n-channel metal-oxide semiconductor (NMOS) transistor. In one embodiment, the control switch 208 is an NPN BJT. In another embodiment, the control switch 208 is a field effect transistor (FET).

In operation, when the load 212 is short-circuited, the output voltage $V_{out}$ suddenly falls from the first threshold voltage level and the output current $I_{out}$ experiences an inrush. The first capacitor 244 detects the decrease in the output voltage $V_{out}$ from the first threshold voltage level and charges to generate the first detection signal DS1. The first detection signal DS1 activates the third transistor 254. The third transistor 254, when activated, conducts the first current signal $I_1$. The first current signal $I_1$ creates a voltage drop across the seventh resistor 256. Based on the voltage drop across the seventh resistor 256, the first control signal CS1 is generated. The first control signal CS1 closes the control switch 208. When the control switch 208 is closed, the voltage level of the control voltage $V_{pu}$ is pulled down to ground, thereby turning on the control transistor 226.

When the control transistor 226 is turned on, the second intermediate voltage $V_{int2}$ is generated. The second intermediate voltage $V_{int2}$ pulls up a voltage level at the gate terminals of the pass transistor 216 and the first transistor 230 to decrease the conduction level of the pass transistor 216 and the first transistor 230. In other words, the second intermediate voltage $V_{int2}$ pulls up a voltage level at the gate terminals of the pass transistor 216 to turn off (i.e., deactivate) the pass transistor 216 and the first transistor 230 for a short duration. Based on the decrease in the conduction level of the pass transistor 216, the inrush in the output current $I_{out}$ is prevented. When the inrush in the output current $I_{out}$ is prevented, the current-limiting circuit 204 takes over the control and limits the output current $I_{out}$ to the desired current level as described in the foregoing. In other words, the first feed-forward circuit 206 operates as a faster path, along with the current-limiting circuit 204 operating as a slow path, to achieve the desired current level without any overshoot, i.e., inrush. The first and second diodes 240 and 248 improve the operational speed of the first feed-forward circuit 206 when the load 212 is shorted multiple times repeatedly.

In one embodiment, when the supply voltage $V_{in}$ increases from the second threshold voltage level, the third transistor 254 is activated. The activation of the third transistor 254 pulls up the voltage level at the gate terminal of the pass transistor 216, which is undesirable in the absence of inrush in the output current $I_{out}$. In such a scenario, the first RC network 234 prevents the pulling up of the voltage level at the gate terminal of the pass transistor 216 by way of the second transistor 238. When the supply voltage $V_{in}$ increases from the second threshold voltage level, the second capacitor 250 charges and generates the second detection signal DS2. The second detection signal DS2 turns on the second transistor 238, thereby pulling down a voltage level of the first control signal CS1 to ground. When the voltage level of the first control signal CS1 is pulled down to ground, the control switch 208 is opened and thus the control transistor 226 is not activated. Hence, the pulling up of the voltage level at the gate terminal of the pass transistor 216, when the supply voltage $V_{in}$ increases, is prevented. In other words, the first feed-forward circuit 206 operates as an AND gate that masks any increase in the supply voltage $V_{in}$ and responds only to the decreasing output voltage $V_{out}$.

It will be apparent to one skilled in the art that the pass transistor 216, the control transistor 226, and the first transistor 230 may be implemented using NMOS transistors without departing from the spirit of invention.

Figure 3:
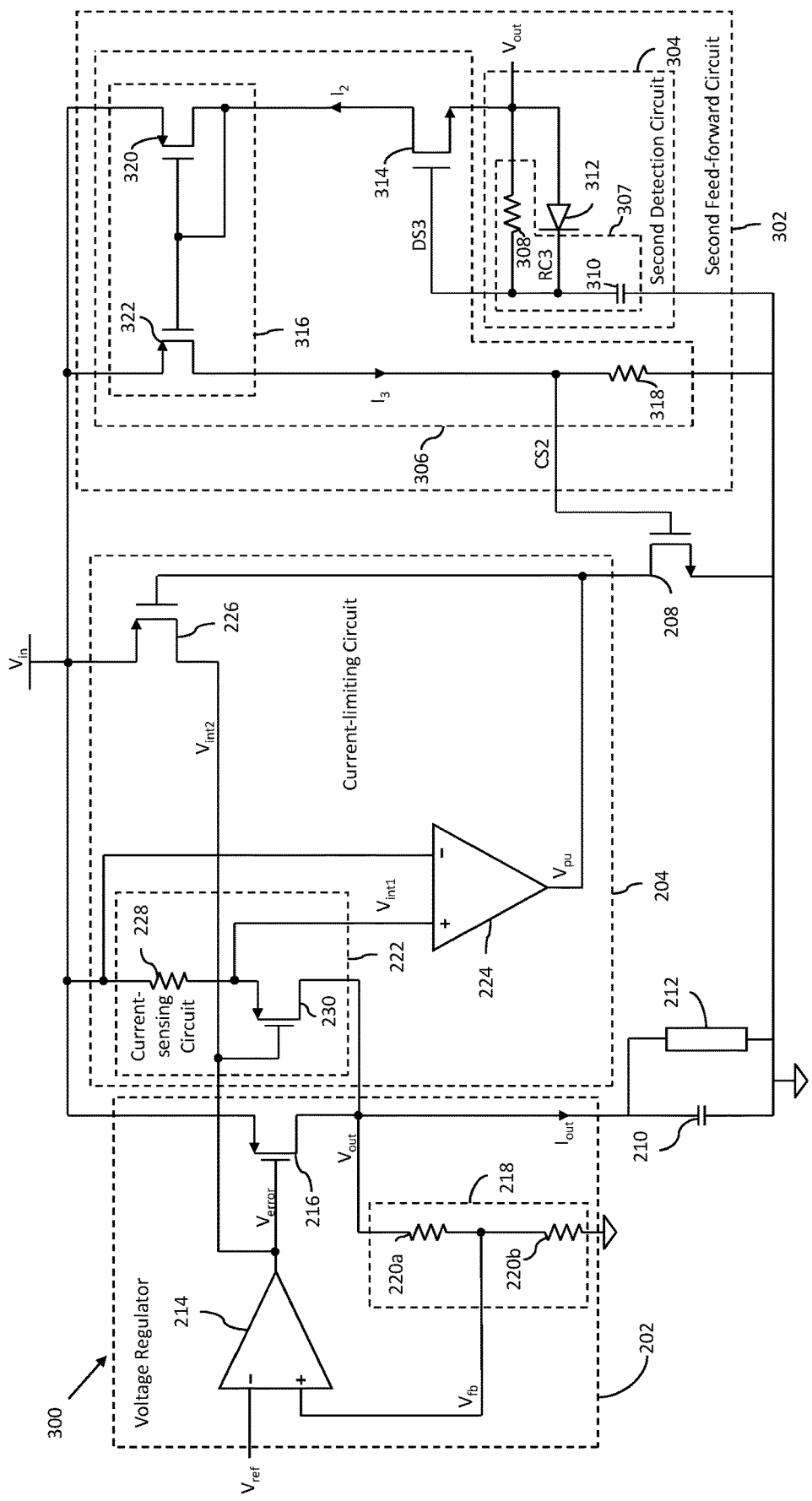
FIG. 3 is a schematic circuit diagram of a voltage regulation system that includes a voltage regulator connected to a current-limiting circuit and a second feed-forward circuit, in accordance with another embodiment of the present invention.

Referring now to FIG. 3, a schematic circuit diagram of a voltage regulation system 300 that includes the voltage regulator 202 connected to the current-limiting circuit 204 and a second feed-forward circuit 302, in accordance with another embodiment of the present invention, is shown. The voltage regulation system 300 further includes the control switch 208, the load capacitor 210, and the load 212.

The second feed-forward circuit 302 receives the supply voltage $V_{in}$ and is connected to the voltage regulator 202 for receiving the output voltage $V_{out}$. The second feed-forward circuit 302 is further connected to the current-limiting circuit 204 by way of the control switch 208. The second feed-forward circuit 302 forms a feed-forward loop to control the inrush in the output current $I_{out}$. The second feed-forward circuit 302 includes a second detection circuit 304 and a second control circuit 306.

The second detection circuit 304 is connected to the voltage regulator 202 for receiving the output voltage $V_{out}$. The second detection circuit 304 is further connected to the second control circuit 306. The second detection circuit 304 includes a third RC network 307 (RC3) including an eighth resistor 308 and a third capacitor 310. The second detection circuit 304 further includes a third diode 312.

The third RC network 307 is connected to the voltage regulator 202 for receiving the output voltage $V_{out}$ and is further connected to ground. The third RC network 307 detects a decrease in the output voltage $V_{out}$ and generates a third detection signal DS3.

The eighth resistor 308 has a first terminal connected to the output terminal of the voltage regulator 202 for receiving the output voltage $V_{out}$ and a second terminal connected to the third capacitor 310. The third capacitor 310 has a first terminal connected to the eighth resistor 308 and a second terminal connected to ground. The third capacitor 310 generates the third detection signal DS3 based on the decrease in the output voltage $V_{out}$. The third diode 312 has a first terminal connected to the first terminal of the eighth resistor 308 and the output terminal of the voltage regulator 202. The third diode 312 further has a second terminal connected to the second terminal of the eighth resistor 308 and the third capacitor 310. The third diode 312 provides a discharge path to the third capacitor 310. Thus, the third diode 312 improves an operational speed of the third RC network 307.

The second control circuit 306 is connected to ground and receives the supply voltage $V_{in}$. The second control circuit 306 is further connected to the second detection circuit 304 for receiving the third detection signal DS3. The second control circuit 306 generates a second control signal CS2 based on the third detection signal DS3. In other words, the second control circuit 306 generates the second control signal CS2, when the second detection circuit 304 detects the decrease in the output voltage $V_{out}$ from the first threshold voltage level. The second control circuit 306 includes a fourth transistor 314, a current-mirror circuit 316, and a ninth resistor 318.

The fourth transistor 314 is an NMOS transistor that has a gate terminal connected to the third capacitor 310 and the eighth resistor 308 for receiving the third detection signal DS3. The fourth transistor 314 further has a source terminal connected to the eighth resistor 308 and the voltage regulator 202, and a drain terminal connected to the current-mirror circuit 316. Based on the third detection signal DS3, the fourth transistor 314 turns on and generates a second current signal $I_2$ at its drain terminal.

The current-mirror circuit 316 is connected to the ninth resistor 318 and is further connected to the fourth transistor 314 for receiving the second current signal $I_2$. The current-mirror circuit 316 mirrors the second current signal $I_2$ and generates a mirrored second current signal $I_3$. The current-mirror circuit 316 includes fifth and sixth transistors 320 and 322. The fifth transistor 320 is a PMOS transistor that has a source terminal for receiving the supply voltage $V_{in}$ and a gate terminal connected to its drain terminal. The gate terminal of the fifth transistor 320 is further connected to a gate terminal of the sixth transistor 322. The sixth transistor 322 is a PMOS transistor that has a source terminal for receiving the supply voltage $V_{in}$ and a drain terminal connected to the ninth resistor 318. The sixth transistor 322 outputs the mirrored second current signal $I_3$ at its drain terminal.

The ninth resistor 318 has a first terminal connected to the drain terminal of the sixth transistor 322 and a second terminal connected to ground. The mirrored second current signal $I_3$ creates a voltage drop across the ninth resistor 318. The voltage drop across the ninth resistor 318 represents the second control signal CS2.

In operation, when the load 212 is short-circuited, the output voltage $V_{out}$ suddenly falls from the first threshold voltage level and the output current $I_{out}$ experiences an inrush. The third capacitor 310 detects the decrease in the output voltage $V_{out}$ from the first threshold voltage level and charges to generate the third detection signal DS3. In one embodiment, the third detection signal DS3 represents a voltage drop across the third capacitor 310.

The third detection signal DS3 activates the fourth transistor 314 and the fourth transistor 314 outputs the second current signal $I_2$ at its drain terminal. Based on the second current signal $I_2$, the fifth and sixth transistors 320 and 322 are turned on to generate the mirrored second current signal $I_3$. The ninth resistor 318 receives the mirrored second current signal $I_3$ and the second control signal CS2 is generated.

The second control signal CS2 closes the control switch 208. When the control switch 208 is closed, the voltage level of the control voltage $V_{pu}$ is pulled down to ground, thereby turning on the control transistor 226. The control transistor 226 then generates the second intermediate voltage $V_{int2}$ to decrease the conduction level of the pass transistor 216 and the first transistor 230, thereby preventing the inrush in the output current $I_{out}$. The third diode 312 improves the operational speed of the second feed-forward circuit 302 when the load 212 is shorted multiple times repeatedly. When the inrush in the output current $I_{out}$ is prevented, the current-limiting circuit 204 takes over the control and limits the output current $I_{out}$ to the desired current level.

It will be understood by one skilled in the art that the use of the first and second feed-forward circuits 206 and 302 for controlling the inrush in the output current $I_{out}$ is not limited to the voltage regulator 202 and the current-limiting circuit 204. In one embodiment, the first and second feed-forward circuits 206 and 302 may be used with other implementations of voltage regulators and current-limiting circuits known in the art.

The first and second feed-forward circuits 206 and 302 for controlling the inrush in the output current $I_{out}$ of the voltage regulator 202 have been described herein. The first and second feed-forward circuits 206 and 302 form a feed-forward loop, and hence the response time of the first and second feed-forward circuits 206 and 302 is faster than the response time of the current-limiting circuit 204. Due to a faster response time, the first and second feed-forward circuits 206 and 302 prevent the inrush in the output current $I_{out}$, thereby preventing any damage caused to the pass transistor 216 due to current inrush. By preventing the inrush in the output current $I_{out}$, the first and second feed-forward circuits 206 and 302 further prevent any increase in the power dissipation in the pass transistor 216.

It will be understood by those skilled in the art that the same logical function may be performed by different arrangements of transistors, resistors, capacitors, or that electronic circuits operate using either positive or negative signals. Therefore, variations in the arrangement of some of the transistors, resistors, capacitors described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A voltage regulation system, comprising:
   a voltage regulator that receives a supply voltage, a reference voltage, and a feedback voltage, and generates an output voltage;
   a current-limiting circuit that receives the supply voltage, and is connected to the voltage regulator, wherein the current-limiting circuit generates a control voltage for controlling an output current of the voltage regulator; and
   a feed-forward circuit that receives the supply voltage, and is connected to the voltage regulator or receiving the output voltage, and generates a control signal to pull down a voltage level of the control voltage, when the output voltage decreases from a first threshold voltage level, thereby controlling an inrush in the output current, wherein the feed-forward circuit comprises:

a detection circuit that is connected to the voltage regulator for receiving the output voltage, wherein the detection circuit detects when the output voltage decreases from the first threshold voltage level; and a control circuit that is connected to the supply voltage, and is further connected to the detection circuit, and generates the control signal, when the detection circuit detects a decrease in the output voltage from the first threshold voltage level, wherein the control circuit comprises:

a first transistor that has an emitter terminal connected to the supply voltage and a base terminal connected to the detection circuit, wherein the first transistor generates a current signal at a collector terminal thereof, when the output voltage decreases from the first threshold voltage level; and a first resistor that is connected to the collector terminal of the first transistor for receiving the current signal, wherein the control signal is generated based on a voltage drop across the first resistor.

2. The voltage regulation system of claim 1, wherein the voltage regulator comprises:

a first differential amplifier that has an inverting terminal for receiving the reference voltage, a non-inverting terminal for receiving the feedback voltage, and an output terminal for generating an error voltage; and a pass transistor that has a source terminal for receiving the supply voltage, a gate terminal connected to the first differential amplifier for receiving the error voltage, and a drain terminal for generating the output voltage, wherein the output voltage is regulated based on the error voltage.

3. The voltage regulation system of claim 2, wherein the voltage regulator further comprises:

a resistive network connected to the drain terminal of the pass transistor for receiving the output voltage and generating the feedback voltage.

4. The voltage regulation system of claim 2, wherein the current-limiting circuit comprises:

a current-sensing circuit that is connected to the supply voltage and the voltage regulator, and generates a first intermediate voltage;

a second differential amplifier that has an inverting terminal for receiving the supply voltage, a non-inverting terminal for receiving the first intermediate voltage, and an output terminal that generates the control voltage; and a control transistor that has a source terminal for receiving the supply voltage, a drain terminal connected to the gate terminal of the pass transistor, and a gate terminal connected to the output terminal of the second differential amplifier for receiving the control voltage, wherein the control transistor is activated based on the control voltage for controlling the output current to attain a threshold current level.

5. The voltage regulation system of claim 4, wherein the current-sensing circuit comprises:

a first resistor that has a first terminal connected to the supply voltage and a second terminal connected to the non-inverting terminal of the second differential amplifier for providing the first intermediate voltage, wherein the first intermediate voltage is based on a voltage drop across the first resistor; and a first transistor that has a source terminal connected to the second terminal of the first resistor, a drain terminal connected to the drain terminal of the pass transistor, and a gate terminal connected to the gate terminal of the pass transistor, wherein the first transistor senses the output current of the voltage regulator.

6. The voltage regulation system of claim 1, wherein the feed-forward circuit further comprises:

a first resistor-capacitor network that is connected to the supply voltage, wherein the first resistor-capacitor network detects an increase in the supply voltage from a second threshold voltage level;

a second resistor that has a first terminal connected to the collector terminal of the first transistor for receiving the current signal; and a second transistor that has a collector terminal connected to a second terminal of the second resistor for receiving the current signal from the first transistor and a base terminal connected to the first resistor-capacitor network, wherein the second transistor is activated by the first resistor-capacitor network to pull down a voltage level of the control signal, when the supply voltage increases from the second threshold voltage level, thereby preventing the control signal from pulling down the voltage level of the control voltage, and wherein the second resistor limits the current signal that is received at the collector terminal of the second transistor, when the first and second transistors are activated.

7. A voltage regulation system, comprising:

a voltage regulator having a differential amplifier and an output transistor, wherein inputs of the differential amplifier receive a reference voltage and a feedback voltage, and wherein the pass transistor has a source terminal connected to receive the supply voltage, a gate terminal connected to an output of the differential amplifier to receive an error voltage, and a drain terminal which generates an output voltage of the voltage regulator;

a current-limiting circuit that receives the supply voltage, and is connected to the voltage regulator, wherein the current-limiting circuit generates a control voltage for controlling an output current of the voltage regulator; and a feed-forward circuit that receives the supply voltage, and is connected to the voltage regulator or receiving the output voltage, and generates a control signal to pull down a voltage level of the control voltage, when the output voltage decreases from a first threshold voltage level, thereby controlling an inrush in the output current, wherein the feed-forward circuit comprises:

a detection circuit that is connected to the voltage regulator for receiving the output voltage, wherein the detection circuit detects when the output voltage decreases from the first threshold voltage level; and a control circuit that is connected to the supply voltage, and is further connected to the detection circuit, and generates the control signal, when the detection circuit detects a decrease in the output voltage from the first threshold voltage level, wherein the control circuit comprises:

a first transistor that has a source terminal connected to the drain terminal of the pass transistor to receive the output voltage of the voltage regulator, a gate terminal connected to the detection circuit, and a drain terminal for generating a current signal, when the output voltage decreases from the first threshold voltage level;

a current-mirror circuit that is connected to the supply voltage, and is further connected to the drain terminal of the first transistor for receiving the current signal and generating a mirrored current signal which mirrors the current signal generated at the drain terminal of the first transistor; and a first resistor that is connected to the current-mirror circuit for receiving the mirrored current signal, wherein the control signal is generated based on a voltage drop across the first resistor.

8. The voltage regulation system of claim 1, wherein the detection circuit comprises:

a first resistor-capacitor network that is connected to the voltage regulator for receiving the output voltage, wherein the first resistor-capacitor network detects a decrease in the output voltage from the first threshold voltage level, and wherein the first resistor-capacitor network enables the control circuit to generate the control signal, when the output voltage decreases from the first threshold voltage level; and a diode that is connected to the first resistor-capacitor network for enabling the first resistor-capacitor network.

9. The voltage regulation system of claim 1, further comprising:

a switch that is connected to the current-limiting circuit, and is further connected to the feed-forward circuit for receiving the control signal, wherein the control signal controls an opening and closing of the switch, and wherein when the switch is closed the voltage level of the control voltage is pulled down to control the inrush in the output current.

10. A voltage regulation system, comprising:

a voltage regulator that receives a supply voltage, a reference voltage, and a feedback voltage, and generates an output voltage;

a current-limiting circuit that receives the supply voltage, and is connected to the voltage regulator, wherein the current-limiting circuit generates a control voltage for controlling an output current of the voltage regulator; and a feed-forward circuit that is connected to the voltage regulator, wherein the feed-forward circuit comprises:

a detection circuit that receives the output voltage from the voltage regulator, wherein the detection circuit detects when the output voltage decreases from a first threshold voltage level; and a control circuit that is connected to the supply voltage, and is further connected to the detection circuit, and generates a control signal to pull down a voltage level of the control voltage, when the detection circuit detects a decrease in the output voltage from the first threshold voltage level, thereby controlling an inrush in the output current, wherein the control circuit comprises:

a first transistor that has an emitter terminal connected to the supply voltage and a base terminal connected to the detection circuit, wherein the first transistor generates a current signal at a collector terminal thereof, when the output voltage decreases from the first threshold voltage level; and a first resistor that is connected to the collector terminal of the first transistor for receiving the current signal, wherein the control signal is generated based on a voltage drop across the first resistor.

11. The voltage regulation system of claim 10, wherein the voltage regulator comprises:

a first differential amplifier that has an inverting terminal for receiving the reference voltage, a non-inverting terminal for receiving the feedback voltage, and an output terminal for generating an error voltage;

a pass transistor that has a source terminal for receiving the supply voltage, a gate terminal connected to the first differential amplifier for receiving the error voltage, and a drain terminal for generating the output voltage, wherein the output voltage is regulated based on the error voltage; and a resistive network connected to the drain terminal of the pass transistor for receiving the output voltage and generating the feedback voltage.

12. The voltage regulation system of claim 11, wherein the current-limiting circuit comprises:

a current-sensing circuit that is connected to the supply voltage and the voltage regulator, and generates a first intermediate voltage;

a second differential amplifier that has an inverting terminal for receiving the supply voltage, a non-inverting terminal for receiving the first intermediate voltage, and an output terminal that generates the control voltage; and a control transistor that has a source terminal for receiving the supply voltage, a drain terminal connected to the gate terminal of the pass transistor, and a gate terminal connected to the output terminal of the second differential amplifier for receiving the control voltage, wherein the control transistor is activated based on the control voltage for controlling the output current to attain a threshold current level.

13. The voltage regulation system of claim 12, wherein the current-sensing circuit comprises:

a first resistor that has a first terminal connected to the supply voltage and a second terminal connected to the non-inverting terminal of the second differential amplifier for providing the first intermediate voltage, wherein the first intermediate voltage is based on a voltage drop across the first resistor; and a first transistor that has a source terminal connected to the second terminal of the first resistor, a drain terminal connected to the drain terminal of the pass transistor, and a gate terminal connected to the gate terminal of the pass transistor, wherein the first transistor senses the output current of the voltage regulator.

14. The voltage regulation system of claim 10, wherein the feed-forward circuit further comprises:

a first resistor-capacitor network that is connected to the supply voltage, wherein the first resistor-capacitor network detects an increase in the supply voltage from a second threshold voltage level;

a second resistor that has a first terminal connected to the collector terminal of the first transistor for receiving the current signal; and a second transistor that has a collector terminal connected to a second terminal of the second resistor for receiving the current signal from the first transistor and a base terminal connected to the first resistor-capacitor network, wherein the second transistor is activated by the first resistor-capacitor network to pull down a voltage level of the control signal, when the supply voltage increases from the second threshold voltage level, thereby preventing the control signal from pulling down the voltage level of the control voltage, and wherein the second resistor limits the current signal that is received at the collector terminal of the second transistor, when the first and second transistors are activated.

15. The voltage regulation system of claim 10, wherein the detection circuit comprises:
  a first resistor-capacitor network that is connected to the voltage regulator for receiving the output voltage, wherein the first resistor-capacitor network detects a decrease in the output voltage from the first threshold voltage level, and wherein the first resistor-capacitor network enables the control circuit to generate the control signal, when the output voltage decreases from the first threshold voltage level; and
  a diode that is connected to the first resistor-capacitor network for enabling the first resistor-capacitor network.

16. The voltage regulation system of claim 10, further comprising:
  a switch that is connected to the current-limiting circuit, and is further connected to the feed-forward circuit for receiving the control signal, wherein the control signal controls an opening and closing of the switch, and wherein when the switch is closed the voltage level of the control voltage is pulled down to control the inrush in the output current.

17. The voltage regulation system of claim 7, wherein the current-limiting circuit comprises:
  a current-sensing circuit that is connected to the supply voltage and the voltage regulator, and generates a first intermediate voltage;
  a second differential amplifier that has an inverting terminal for receiving the supply voltage, a non-inverting terminal for receiving the first intermediate voltage, and an output terminal that generates the control voltage; and
  a control transistor that has a source terminal for receiving the supply voltage, a drain terminal connected to the gate terminal of the pass transistor, and a gate terminal connected to the output terminal of the second differential amplifier for receiving the control voltage, wherein the control transistor is activated based on the control voltage for controlling the output current to attain a threshold current level.

18. The voltage regulation system of claim 17, wherein the current-sensing circuit comprises:
  a first resistor that has a first terminal connected to the supply voltage and a second terminal connected to the non-inverting terminal of the second differential amplifier for providing the first intermediate voltage, wherein the first intermediate voltage is based on a voltage drop across the first resistor; and
  a first transistor that has a source terminal connected to the second terminal of the first resistor, a drain terminal connected to the drain terminal of the pass transistor, and a gate terminal connected to the gate terminal of the pass transistor, wherein the first transistor senses the output current of the voltage regulator.

19. The voltage regulation system of claim 7, wherein the detection circuit comprises:
  a first resistor-capacitor network that is connected to the voltage regulator for receiving the output voltage, wherein the first resistor-capacitor network detects a decrease in the output voltage from the first threshold voltage level, and wherein the first resistor-capacitor network enables the control circuit to generate the control signal, when the output voltage decreases from the first threshold voltage level; and
  a diode that is connected to the first resistor-capacitor network for enabling the first resistor-capacitor network.

20. The voltage regulation system of claim 7, further comprising:
  a switch that is connected to the current-limiting circuit, and is further connected to the feed-forward circuit for receiving the control signal, wherein the control signal controls an opening and closing of the switch, and wherein when the switch is closed the voltage level of the control voltage is pulled down to control the inrush in the output current.

* * * * *